United States Patent
Jung et al.

(10) Patent No.: US 10,907,909 B2
(45) Date of Patent: Feb. 2, 2021

(54) MOUNTING DEVICE WITH HEAT PIPE DISPOSED INSIDE AND DISPLAY DEVICE HAVING THE SAME

(71) Applicant: Samsung Display Co., LTD., Yongin (KR)

(72) Inventors: YoungGyu Jung, Seongnam-si (KR); Yongjun Lee, Hwaseong-si (KR)

(73) Assignee: SAMSUNG DISPLAY CO., LTD., Gyeonggi (KR)

( * ) Notice: Subject to any disclaimer, the term of this patent is extended or adjusted under 35 U.S.C. 154(b) by 0 days.

(21) Appl. No.: 16/791,029

(22) Filed: Feb. 14, 2020

(65) Prior Publication Data
US 2020/0292241 A1 Sep. 17, 2020

(30) Foreign Application Priority Data
Mar. 15, 2019 (KR) .................. 10-2019-0029677

(51) Int. Cl.
| F28D 15/02 | (2006.01) |
| F16M 11/10 | (2006.01) |
| F16M 13/02 | (2006.01) |

(52) U.S. Cl.
CPC ......... *F28D 15/0275* (2013.01); *F16M 11/10* (2013.01); *F16M 13/027* (2013.01)

(58) Field of Classification Search
CPC ... F28D 15/0275; F16M 11/10; F16M 13/027
USPC ......................................................... 348/836
See application file for complete search history.

(56) References Cited

U.S. PATENT DOCUMENTS

| 6,125,035 A * | 9/2000 | Hood ................ G06F 1/203 361/679.47 |
| 7,924,560 B2 | 4/2011 | Sakata et al. |
| 9,291,298 B2 | 3/2016 | Shin et al. |
| 10,317,615 B2 | 6/2019 | Kim |
| 2008/0291613 A1* | 11/2008 | Sakata ................ H04N 5/64 361/679.06 |
| 2013/0094147 A1* | 4/2013 | Shin ................ G06F 1/1601 361/707 |
| 2014/0300872 A1 | 10/2014 | Kim et al. |
| 2015/0215634 A1* | 7/2015 | Jia ................ H04N 19/70 375/240.03 |

FOREIGN PATENT DOCUMENTS

| KR | 10-0659339 A | 12/2006 |
| KR | 1020080103429 A | 11/2008 |
| KR | 1020140121525 A | 10/2014 |
| KR | 10-1514399 B1 | 4/2015 |
| KR | 10-1873740 B1 | 6/2018 |
| KR | 1020180076546 A | 7/2018 |

OTHER PUBLICATIONS https://cafe.naver.com/fpsgame/151010, retrieved from Internet on Jul. 5, 2019.

* cited by examiner

*Primary Examiner* — Marnie A Matt
(74) *Attorney, Agent, or Firm* — Cantor Colburn LLP

(57) ABSTRACT

A display device includes a display module from which heat is emitted; a connection rod coupled to the display module and with which the display module is mountable to a structure disposed external to the display device and spaced apart from the display module along a first direction, the connection rod lengthwise extending along the first direction; and a heat pipe disposed inside the connection rod and lengthwise extending along the first direction.

20 Claims, 9 Drawing Sheets

MOUNTING DEVICE WITH HEAT PIPE DISPOSED INSIDE AND DISPLAY DEVICE HAVING THE SAME

This applications claims priority to Korean Patent Application No. 10-2019-0029677 filed on Mar. 15, 2019, and all the benefits accruing therefrom under 35 U.S.C. § 119, the entire contents of which are hereby incorporated by reference.

BACKGROUND

(1) Field

Embodiments of the invention described herein relate to a mounting device having improved heat radiation performance and a display device including the same.

(2) Description of the Related Art

A display device uses a ceiling-fixed type mounting device, which is fixed onto the ceiling, or a stand-type mounting device positioned on the floor, to maximize space utilization.

In the display device, a display module which generates and displays an image (e.g., display content) has been enlarged in size and designed with higher resolution. In particular, when the display device is installed outdoors, the display device has relatively high brightness so as to ensure visibility the display content which is displayed by the display device.

SUMMARY

Embodiments of the invention provide a mounting device having improved heat radiation performance and a display device including the same.

According to an exemplary embodiment, a display device may include a display module from which heat is emitted; a connection rod coupled to the display module and with which the display module is mountable to a structure disposed external to the display device and spaced apart from the display module along a first direction, the connection rod lengthwise extending along the first direction; and a heat pipe disposed inside the connection rod and lengthwise extending along the first direction.

The display device may further include a heat radiation plate disposed at an end portion of the heat pipe.

The display device may further include a fan disposed at an end portion of the heat pipe.

The display device may further include a heat radiation tape which surrounds a portion of the heat pipe.

A plurality of heat pipes may be provided inside the connection rod.

The display device may further include a bracket coupled the display module, and a rotation coupling member pivotably connecting the bracket and the connection rod to each other.

The connection rod may include end portions opposing each other along the first direction, and the rotation coupling member may be coupled to a first end portion of the connection rod which is closest along the first direction to the display module among the end portions opposing each other. The display device may further include a fixing member coupled to a second end portion of the connection rod which is furthest along the first direction from the display module among the end portions opposing each other.

The display device may further include a hole defined in the fixing member coupled to the second end portion of the connection rod, and a fan disposed inside the hole.

The heat pipe may include a heat-carrying material which circulates inside the heat pipe.

The heat-carrying material may include water, ethanol or alcohol.

The display module may be a liquid crystal display module or an organic light emitting display module.

The display module may have a display surface parallel to a plane defined by the first direction and a second direction which crosses the first direction.

According to an exemplary embodiment, a mounting device may include a connection rod including: a first end portion at which the connection rod is coupleable to a heat-generating display module, a second end portion opposing the first end portion along a first direction, and an inner space extending along the first direction, between the first end portion and the second end portion; a bracket connected to the first end portion of the connection rod; a fixing member connected to the second end portion of the connection rod; and a heat pipe which carries heat, the heat pipe disposed at the inner space of the connection rod and extending along the first direction, between the first end portion and the second end portion of the connection rod.

The mounting device may further include a heat radiation plate disposed at an end portion of the heat pipe.

The mounting device may further include a fan disposed at an end portion of the heat pipe.

The mounting device may further include a heat radiation tape which surrounds a portion of the heat pipe.

The mounting device may further include a hole in the fixing member, and a fan disposed inside the hole.

The heat pipe may include a heat-carrying material which circulates inside the heat pipe.

The heat-carrying material may include water, ethanol or alcohol.

The heat pipe may be a sintered heat pipe.

BRIEF DESCRIPTION OF THE DRAWINGS

The above and other objects and features will become apparent from the following description with reference to the following figures, where like reference numerals refer to like parts throughout the various figures unless otherwise specified, and where.

DETAILED DESCRIPTION

Figure 1A:
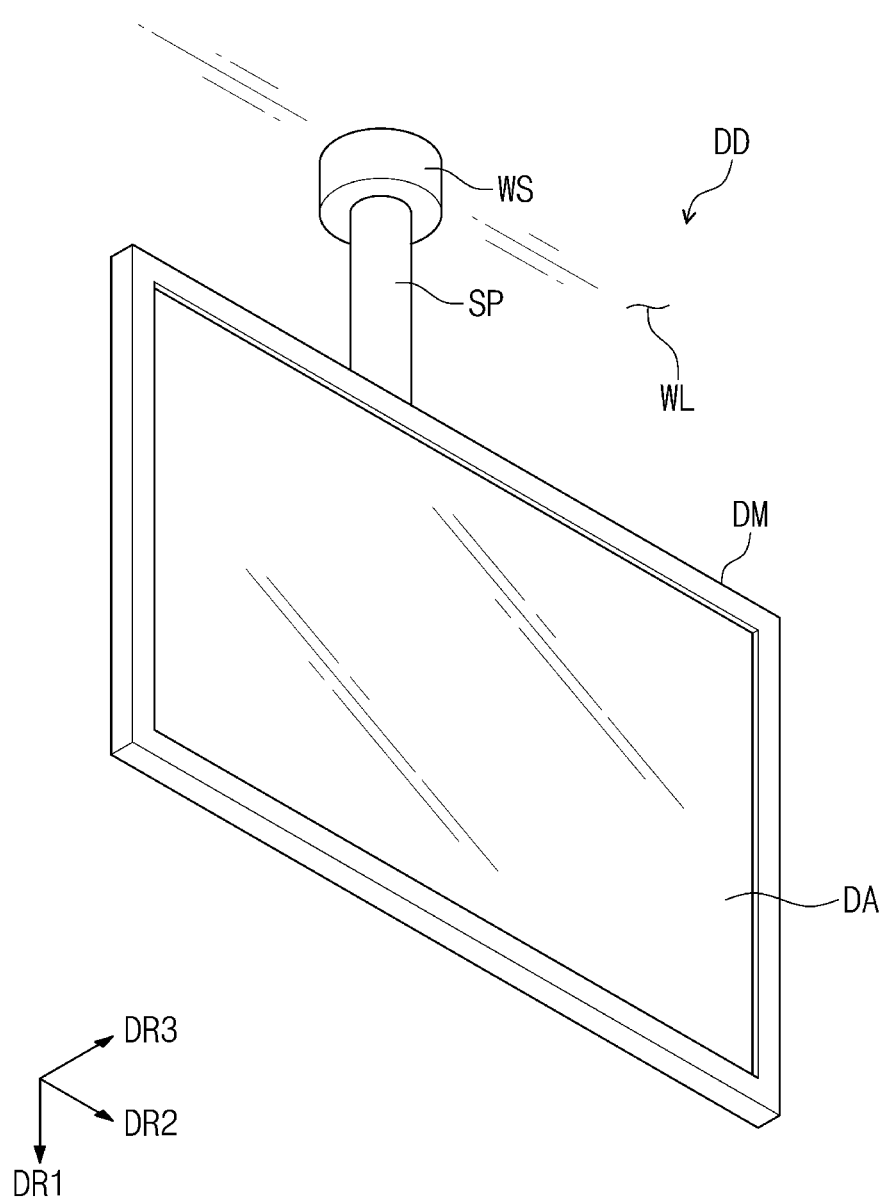
FIG. 1A is a perspective front view illustrating an embodiment of a display device relative to a structure to which the display device is mounted.

In this specification, it will be understood that, when a component (or an area, a layer, a part, or the like) is referred to as being related to another element such as being "on," "connected to" or "coupled to" another component, it can be directly disposed on/connected to/coupled to the another component or a third intervening component may be present therebetween. In contrast, when a component (or an area, a layer, a part, or the like) is referred to as being related to another element such as being "directly on," "directly connected to" or "directly coupled to" another component, no intervening component is present therebetween. As used herein, terms such as "connected" or "coupled" include a physical, mechanical, fluid and/or thermal relationship between elements.

The same reference numeral will be assigned to the same component. The thickness, ratio, and size of each component illustrated in the drawings may be exaggerated for the purpose of effectively explaining the technical content.

Although the terms first, second, or the like may be used herein to describe various components, these components should not be limited by these terms. These terms are used to distinguish one component from another component. For example, a first component discussed below could be termed a second component without departing from the technical scope of the invention. Similarly, the second component could be termed the first component. The singular forms are intended to include the plural forms unless the context clearly indicates otherwise.

In addition, the terms "under," "at a lower portion," "above" or "an upper portion" is used to describe the relationship between components illustrated in drawings. The terms indicate a relative concept and described with reference to directions illustrated in the drawings.

Unless otherwise defined, all terms used herein (including technical or scientific terms) have the same meanings as those generally understood by those skilled in the art to which the invention pertains Such terms as those defined in a generally used dictionary may be to be interpreted as having meanings equal to the contextual meanings in the relevant field of art, and not to be interpreted as having ideal or excessively formal meanings unless clearly defined herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or" includes any and all combinations of one or more of associated components. It will be further understood that the terms "comprises," "comprising," "includes," or "including," or "having" specify the presence of stated features, numbers, steps, operations, components, parts, or the combination thereof, but do not preclude the presence or addition of one or more other features, numbers, steps, operations, components, components, and/or the combination thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a display device having a relatively higher brightness is implemented, such as being used outdoors, defects in a display module of the display device may occur due to heat emission from the display module resulting from an increased electrical current within the display device to generate the brightness level.

Hereinafter, embodiments of the invention will be described with reference to accompanying drawings.

Figure 1B:
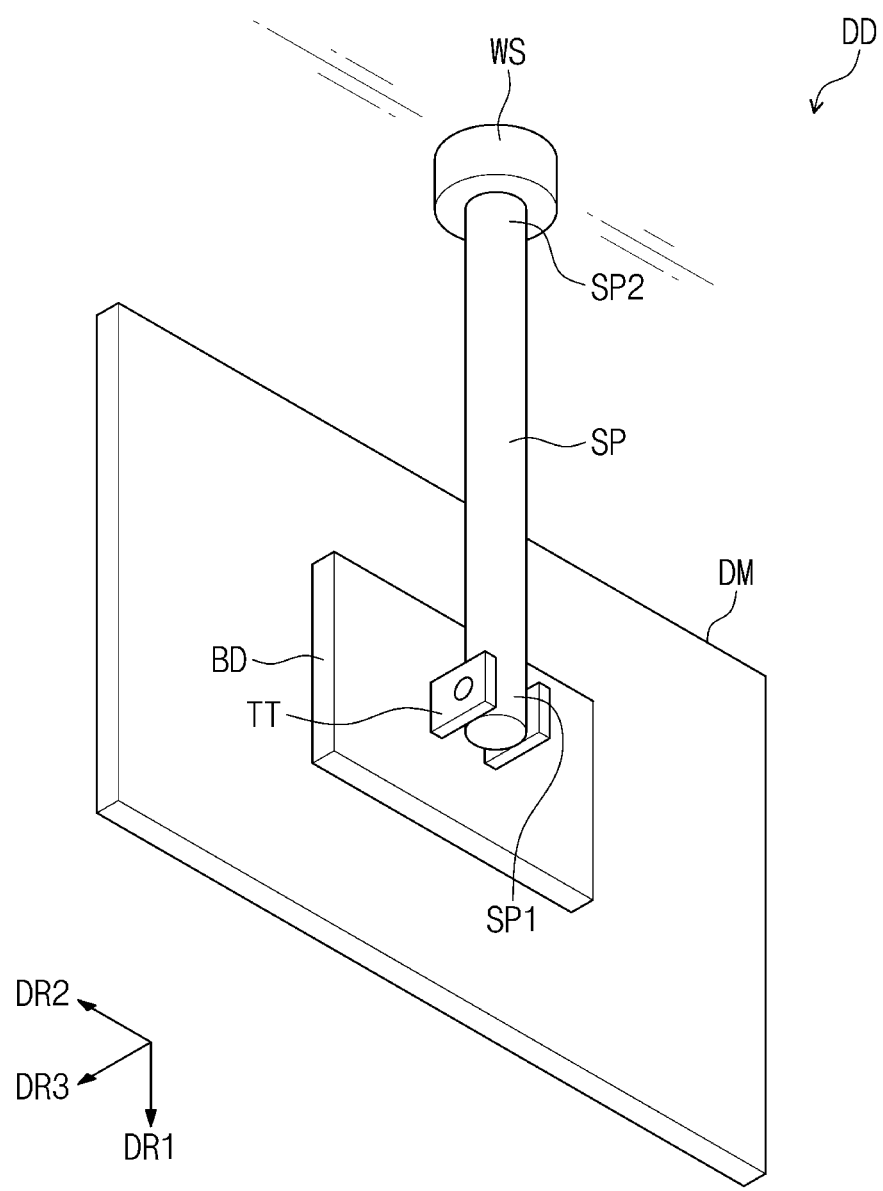
FIG. 1B is a perspective rear view illustrating a display device relative to the structure.

FIG. 1A is a perspective front view illustrating an embodiment of a display device relative to a structure to which the display device is mounted, and FIG. 1B is a perspective rear view illustrating the display device relative to the structure.

Referring to FIGS. 1A and 1B, a display device DD may be activated in response to an electrical signal. Activation of the display device DD may include turning on of the display device DD, generating and/or displaying an image by the display device DD, etc. The display device DD may include various embodiments. According to one or more embodiment of the invention, the display device DD may include an electronic device such as a television, a monitor or an outdoor billboard. In the present embodiment, the display device DD is a ceiling-mounted television, which is fixed onto the ceiling WL as a structure to which the display device DD is mounted, by way of example. The structure (e.g., the ceiling WL) is disposed external to the display device DD and spaced apart from the display module DM along a first direction DR1. In FIGS. 1A and 1B, a downward vertical direction indicates a direction of gravity.

The display device DD may include a display module DM, a bracket BD, a rotation coupling member TT, a connection rod SP, and a fixing member WS.

The display module DM may include a light receiving display module or a light emitting display module. The light receiving display module may be, for example, a liquid crystal display module. The light emitting display module may be, for example, an organic light emitting display module or a quantum dot light emitting display module. A light emitting layer of the organic light emitting display module may include an organic light emitting material. A light emitting layer of the quantum dot light emitting display module may include a quantum dot and a quantum rod.

The display module DM may include or be provided with a display area DA which is visible from outside the display device DD. A front surface of the display module DM may define a front surface or display surface of the display device DD. The display area DA and/or display surface may be defined in parallel to a plane defined by the first direction DR1 and a second direction DR2 which crosses the first direction DR1. A direction (e.g., vertical direction) which is normal to the display area DA or the display surface may correspond to a third direction DR3 (hereinafter also referred to as a thickness direction) of the display module DM. The thickness direction may apply to the display device DD and/or components thereof, including the display module DM.

Directions indicated by the first, second, and third directions DR1, DR2 and DR3 are relative to each other, so the directions may be changed to different directions. Hereinafter, the first to third directions are indicated by the first direction to the third direction DR1, DR2 and DR3, respectively, and refer to the same relevant reference numerals.

The third direction DR3 may be a direction crossing the first direction DR1 and the second direction DR2. The first direction DR1, the second direction DR2, and the third direction DR3 may be perpendicular to each other, without being limited thereto.

The bracket BD may be coupled to a back surface of the display module DM which is opposite to the front surface thereof. The bracket BD may include a material having a relatively high thermal conductivity. The bracket BD may be coupled to a portion of the display module DM at which heat is emitted. In an embodiment, for example, when the display module DM is a liquid crystal display module, the bracket BD may be coupled to a portion of the display module DM which corresponds to the light source of a backlight unit. However, this is provided only for illustrative purpose, and the bracket BD may be coupled to various portions of the display module DM according to an embodiment of the invention. Considering an entire planar area of the back surface of the display module DM, the bracket BD may be coupled to a center of the back surface of the display module DM, without being limited thereto.

In a plan view of the back surface of the display module DM, the bracket BD may have a rectangular planar shape. However, this is provided only for illustrative purpose, and the bracket BD may have various planar shapes according to an embodiment of the invention. In an embodiment, for example, the bracket BD may have a ladder planar shape defined by a plurality of bars spaced apart from each other.

The rotation coupling member TT may be interposed between the bracket BD and the connection rod SP, to pivotably connect the bracket BD and the connection rod SP to each other. The rotation coupling member TT may be coupled to a first end portion SP1 of the connection rod SP. The rotation coupling member TT connected to the bracket BD connected to the display module DM, may adjust the angle of the display module DM. The display surface of the display module DM is viewable from different viewpoints by setting a proper angle of the display module DM by actuation of the rotation coupling member TT. However, this is provided only for the illustrative purpose, and the rotation coupling member TT may be omitted according to an embodiment of the invention.

The connection rod SP may be coupled to the rotation coupling member TT and/or the bracket BD. The connection rod SP may extend along the first direction DR1 to define a length extended along the first direction DR1. The connection rod SP may support the display module DM at a distance from a structure, such as the ceiling WL. Although FIGS. 1A and 1B illustrate that the display module DM is supported on the ceiling WL, this is provided only for the illustrative purpose, but the invention is not limited thereto.

The fixing member WS may be coupled to a second end portion SP2 of the connection rod SP. That is, among the first end portion SP1 and the second end portion SP2, the first end portion SP1 is closest to the display module DM while the second end portion SP2 is closest to the external structure (e.g., ceiling WL). The same one of the fixing member WS which is coupled to the second end portion SP2 of the connection rod SP may be coupled onto the ceiling WL. The fixing member WS and the connection rod SP may dispose the display module DM at a distance from the ceiling WL.

The fixing member WS may be coupled to the ceiling WL such by a screw (not illustrated), but the configuration of coupling the fixing member WS onto the ceiling WL is not limited to the example. In an embodiment, for example, the fixing member WS may be joined to the ceiling WL by a rivet, welding, or an adhesive member.

The bracket BD, the rotation coupling member TT, the connection rod SP, and the fixing member WS may constitute a mounting device with which the display module DM is mounted to a structure at a distance therefrom. By such mounting device, the display module DM may be suspended at a distance from an external structure.

Figure 2:
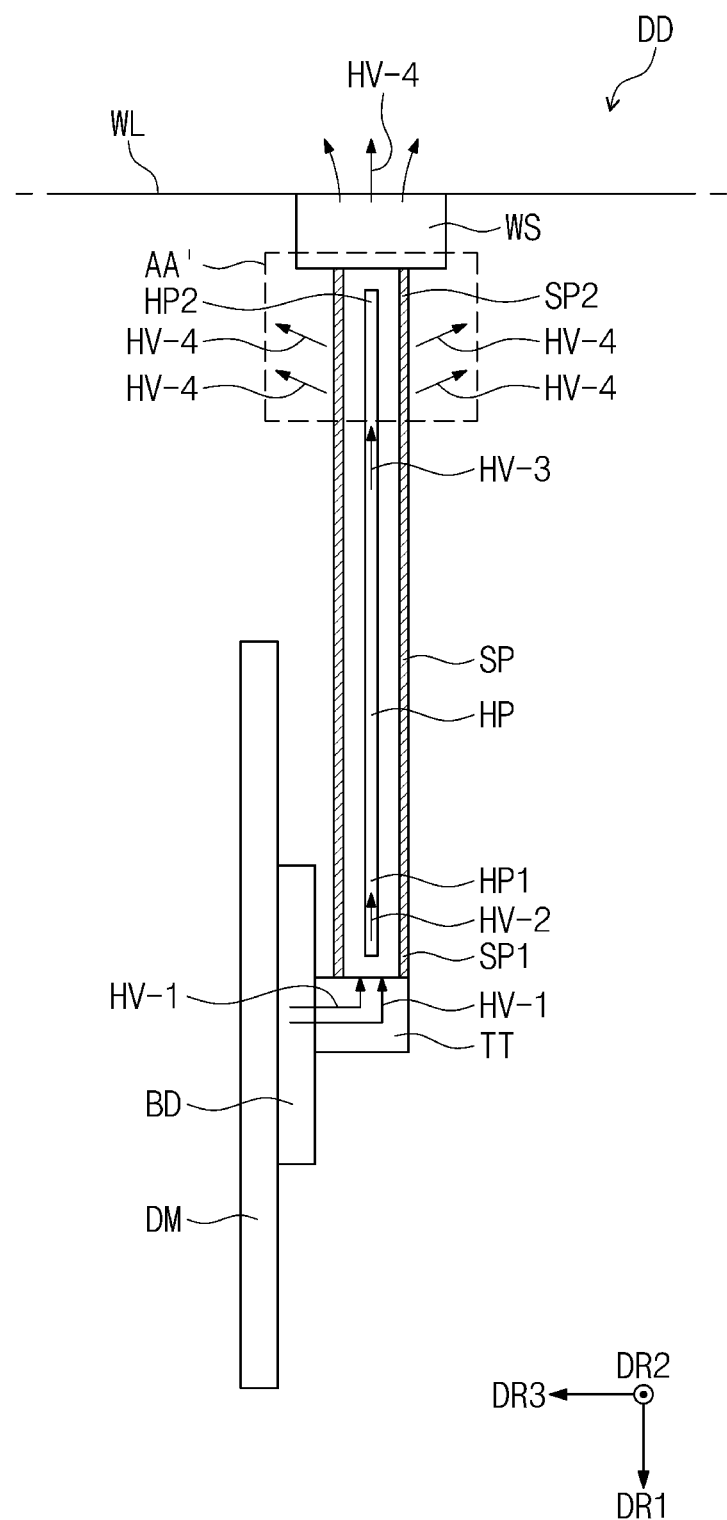
FIG. 2 is a cross-sectional view illustrating the display device.
Figure 3:
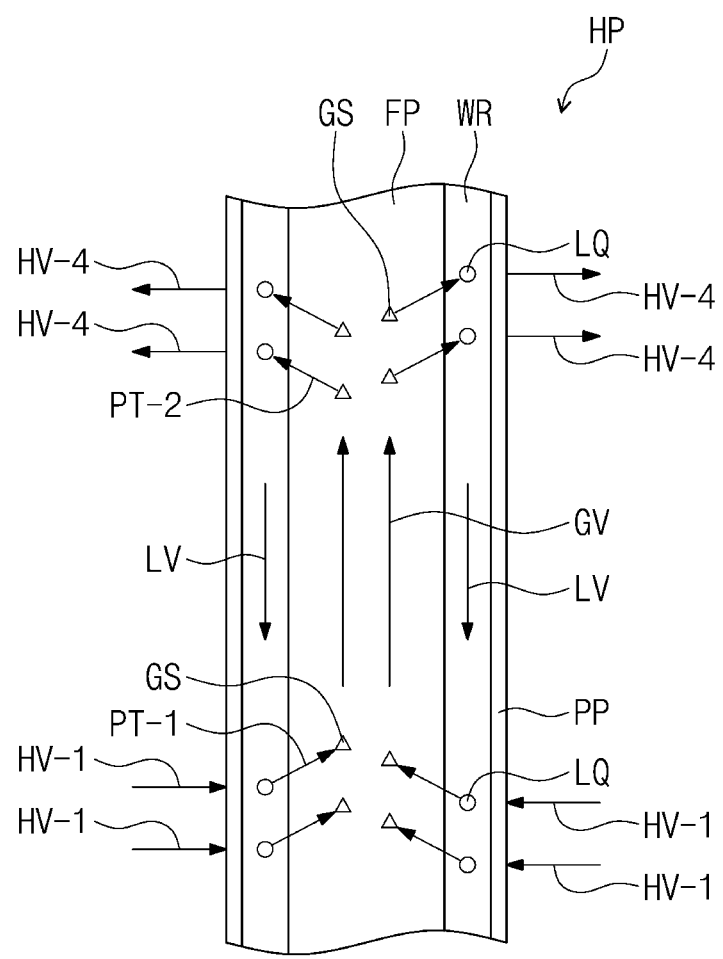
FIG. 3 is a cross-sectional view illustrating an embodiment of a heat path relative to a heat radiation member of a display device.
Figure 3:
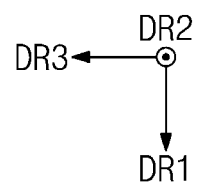

FIG. 2 is a cross-sectional view illustrating the display device, and FIG. 3 is a cross-sectional view illustrating an embodiment of a heat path relative to a heat radiation member of a display device.

Referring to FIGS. 2 and 3, the connection rod SP may lengthwise extend along the first direction DR1. The connection rod SP may have a hollow space provided or formed therein.

A heat radiation member of the display device DD may include the connection rod SP and a heat pipe HP. The heat pipe HP is disposable in an internal space of the connection rod SP, e.g., the hollow space provided therein. The heat pipe HP may extend along the first direction DR1. The heat pipe HP may transfer the heat emitted from the display module DM to an area which is disposed remote from the display module DM.

The heat pipe HP may include or be defined by a heating portion HP1 and a condensing portion HP2. The heating portion HP1 may be a portion of the heat pipe HP that absorbs heat incident thereto from a heat source. The condensing portion HP2 may be a portion of the heat pipe HP from which heat is radiated. Working materials LQ and GS (e.g., liquid LQ and gas GS), which carry heat (e.g., heat-carrying material) to therefore transfer heat from the heating portion HP1 to the condensing portion HP2, may be flowable inside the heat pipe HP. The working materials LQ and GS may include, but are not limited to, water, ethanol, or alcohol.

A heat-carrying material (e.g., a heat-carrying liquid), such as water or alcohol, is disposed in the heat pipe HP. A pressure of the heat-carrying material reduceable, vaporizable at the heating portion HP1 into a heat-carrying material such as gas GS, and movable to the condensing portion HP2 from the heating portion HP1. Heat is radiated from the condensing portion HP2 by a heat-carrying material in the form of a liquid. In this case, the liquid returns to the heating portion HP1 by a capillary phenomenon. This operation is repeated, so heat may be transferred from the heating portion HP1 to the condensing portion HP2.

The heat pipe HP may further include a pipe PP, a fluid passage FP within the pipe PP, and a wire structure WR. The heating portion HP1 of the heat pipe HP may be disposed closer to the display module DM than the condensing portion HP2. The heating portion HP1 may be in thermal contact with the display module DM, such as through the bracket BD and/or the rotation coupling member TT connected thereto.

The wire structure WR may be disposed on an inner wall of the pipe PP, to be closer to walls of the pipe PP than the fluid passage FP. In other words, the pipe PP may surround an outer portion of the wire structure WR. The pipe PP may receive heat from the heat source and may radiate the heat to outside the pipe PP. The heat pipe HP may lengthwise extend along a length of the connection rod SP, such as along the first direction DR1. The pipe PP may be a hollow pipe.

The pipe PP may include a material having a relatively high thermal conductivity. In an embodiment, for example, the pipe PP may include a thermally conductive material such as aluminum (Al) or copper (Cu).

The pipe PP may have the fluid passage FP provided therein. The fluid passage FP may be a passage through which the working materials LQ and GS are movable. The working materials LQ and GS may transfer heat received from a heat source to the condensing portion HP2, by moving along the fluid passage FP. The fluid passage FP may lengthwise extend along a length of the connection rod SP, such as along the first direction DR1. The length of the fluid passage FP may be parallel to the length of the pipe PP. The liquid LQ and/or the gas GS may move through the fluid passage FP along the length thereof.

The wire structure WR may be interposed between the pipe PP and the fluid passage FP. The wire structure WR may return the working materials LQ and GS from the condensing portion HP2 to the heating portion HP1 respectively at opposing ends of the heat pipe HP. In this case, the working materials LQ and GS may move along a length of the wire structure WR, to the heating portion HP1 from the condensing portion HP2, using capillary force generated as the working materials LQ and GS make contact with the wire structure WR.

The wire structure WR may include wires in relatively small or fine sizes. In an embodiment, for example, the wires may have diameters in the range of several nanometers to several hundreds of micrometers. In an embodiment, for example, the wires may lengthwise extend along a length of the connection rod SP, such as along the first direction DR1. The wire structure WR may include wires including or formed of materials which allow the working materials LQ and GS to generate capillary force therewith. In an embodiment, for example, the wire structure WR may include carbon wires. However, this is provided only for the illustrative purpose. According to an embodiment of the invention, the wire structure WR may include various types of wires and materials thereof.

The bracket BD may transfer first heat HV-1 emitted from the display module DM to the heating portion HP1 of the heat pipe HP. That is, the bracket BD may thermally connect the display module DM to the heat pipe HP.

The first heat HV-1 received by the heat pipe HP at the heating portion HP1, may be transferred to the liquid LQ of the heat pipe HP. The liquid LQ may receive the first heat HV-1 and may be converted into the gas GS through a first phase transition PT-1. The gas GS may receive and retain an entirety or a portion of the first heat HV-1, through the first phase transition PT-1. The gas GS having the first heat HV-1 may move along the heat pipe HP to the condensing portion HP2, through the fluid passage FP.

The first heat HV-1 which is transferred from outside the connection rod SP to an inside of the connection rod SP and the heat pipe HP (e.g., at the liquid LQ and the gas GS) is expressed as second heat HV-2. That is, the first heat HV-1 may be transferred from outside the heat pipe HP to inside thereof as the second heat HV-2, through the first phase transition PT-1. The temperature of the second heat HV-2 may be equal to or lower than the temperature of the first heat HV-1. The transfer direction of the second heat HV-2 may be the moving direction GV of the gas GS along the heat pipe HP, from the heating portion HP1 to the condensing portion HP2. The second heat HV-2 may be transferred along the first direction DR1.

The second heat HV-2 transferred along the first direction DR1 and along a length portion of the heat pipe HP, to be disposed at a distance from the heating portion HP1, is expressed as third heat HV-3. The third heat HV-3 may arrive at the condensing portion HP2 be incident to the condensing portion HP2. The temperature of the third heat HV-3 may be equal to or lower than the temperature of the second heat HV-2. The transfer direction of the third heat HV-3 may be the moving direction GV of the gas GS. The gas GS having the third heat HV-3 may be incident to the condensing portion HP2. The gas GS may be converted into the liquid LQ through a second phase transition PT-2. Conversion of the gas GS having the third heat HV-3 into the liquid LQ at the condensing portion HP2, discharges fourth heat HV-4 from the liquid LQ to outside the heat pipe HP.

The liquid LQ converted at the second phase transition PT-2 may be moved back to the heating portion HP1 from the condensing portion HP2, using the capillary force in the wire structure WR. The transfer direction of the liquid LQ converted at the second phase transition PT-2 may be the moving direction LV of the liquid LQ along a length of the wire structure WR.

The third heat HV-3 discharged from the heat pipe HP is expressed as fourth heat HV-4. That is, an entirety or a portion of the third heat HV-3 may be discharged from the heat pipe HP to outside thereof as the fourth heat HV-4, through the second phase transition PT-2. The temperature of the fourth heat HV-4 may be equal to or lower than the temperature of the third heat HV-3. The fourth heat HV-4 may be transferred to the atmosphere, e.g., to an environment outside of the heat pipe HP.

Since the heat pipe HP is disposed within an inner space of the connection rod SP, the fourth heat HV-4 may be dispersed in an area between the heat pipe HP and the inner wall of the connection rod SP. Since the fourth heat HV-4 is emitted proximate to the fixing member WS, the fourth heat HV-4 may be transferred from the heat pipe HP and the connection rod SP, to the fixing member WS in thermal connection therewith, and then to the structure (e.g., ceiling WL) in thermal connection with the fixing member WS. That is, the fourth heat HV-4 may be ultimately transferred to the ceiling WL (see FIG. 1A) through the fixing member WS.

According to one or more embodiment of the invention, the first heat HV-1 emitted from the display module DM may be transferred away from the display module DM and ultimately radiated to an area outside of the display module DM as the fourth heat HV-4, through the heat pipe HP. As a result, the heat radiation function of the display device DD may be further improved. The display device DD having the improved heat radiation function may increase the electrical current input thereto and may increase brightness thereof to improve overall display quality.

Figure 4:
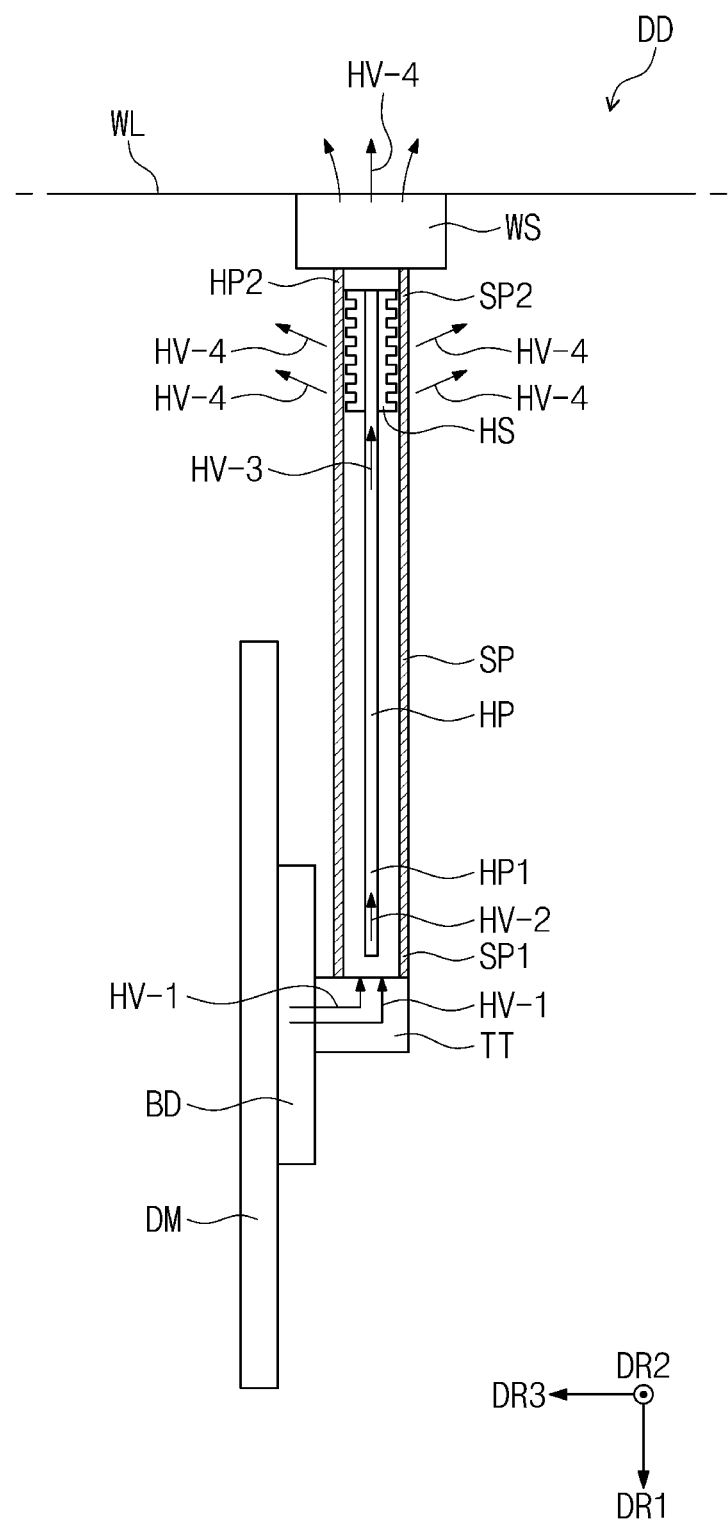
FIG. 4 is a cross-sectional view illustrating another embodiment of a display device.

FIG. 4 is a cross-sectional view illustrating another embodiment of a display device.

Referring to FIG. 4, a heat radiation plate HS of the heat pipe HP may be provided proximate to the fixing member WS. In an embodiment, for example, the heat radiation plate HS may be disposed at the condensing portion HP2 at the second end portion SP2. However, this is provided only for illustrative purpose, and the heat radiation plate HS may be disposed in any of a number of locations along al length of the heat pipe HP.

The heat radiation plate HS may make physical contact with the heat pipe HP to directly or indirectly discharge the heat emitted from the heat pipe HP to outside the connection rod SP. The heat radiation plate HS may surround a portion of the heat pipe HP, to be disposed between an inner wall of the connection rod SP and an outer wall of the heat pipe HP, without being limited thereto.

As the surface area of the heat radiation plate HS is increased (e.g., by protrusions/recesses of the heat radiation plate HS shown in FIG. 4), the heat radiation effect by the heat pipe HP may be increased. The heat radiation plate HS may include a cylindrical heat sink. However, the heat radiation plate HS according to an embodiment of the invention is not limited thereto. In an embodiment, for example, the heat radiation plate HS may have a honeycomb shape or a wave shape which provides an increased surface area by which heat is radiated.

The heat radiation plate HS may relatively easily discharge the third heat HV-3 which is transferred through the heat pipe HP to the second end portion SP2, to outside the connection rod SP. The third heat HV-3 discharged to the outside of the connection rod SP may be represented as the fourth heat HV-4. The third heat HV-3 from the condensing portion HP2 of the heat pipe HP is efficiently radiated by the heat radiation plate HS in contact with the heat pipe HP, to be the fourth heat HV-4 emitted from the connection rod SP. Accordingly, the heat radiation function of the display device DD may be improved. Additionally, deterioration and the life span of the display module DM, which are caused by heat emitted from the display module DM, may be reduced or effectively prevented.

According to one or more embodiment of the invention, the heat pipe HP may transfer heat emitted from the display module DM, away from the display module DM. The heat radiation plate HS coupled to the heat pipe HP (e.g., being in physical contact with or in close proximity thereto) may efficiently transfer the heat emitted from the display module DM to a location disposed at a distance from the display module DM. Accordingly, the heat radiation function of the display device DD may be more improved. The display device DD having the improved heat radiation function may increase electrical current input thereto and may increase brightness thereof to improve overall display quality.

Figure 5:
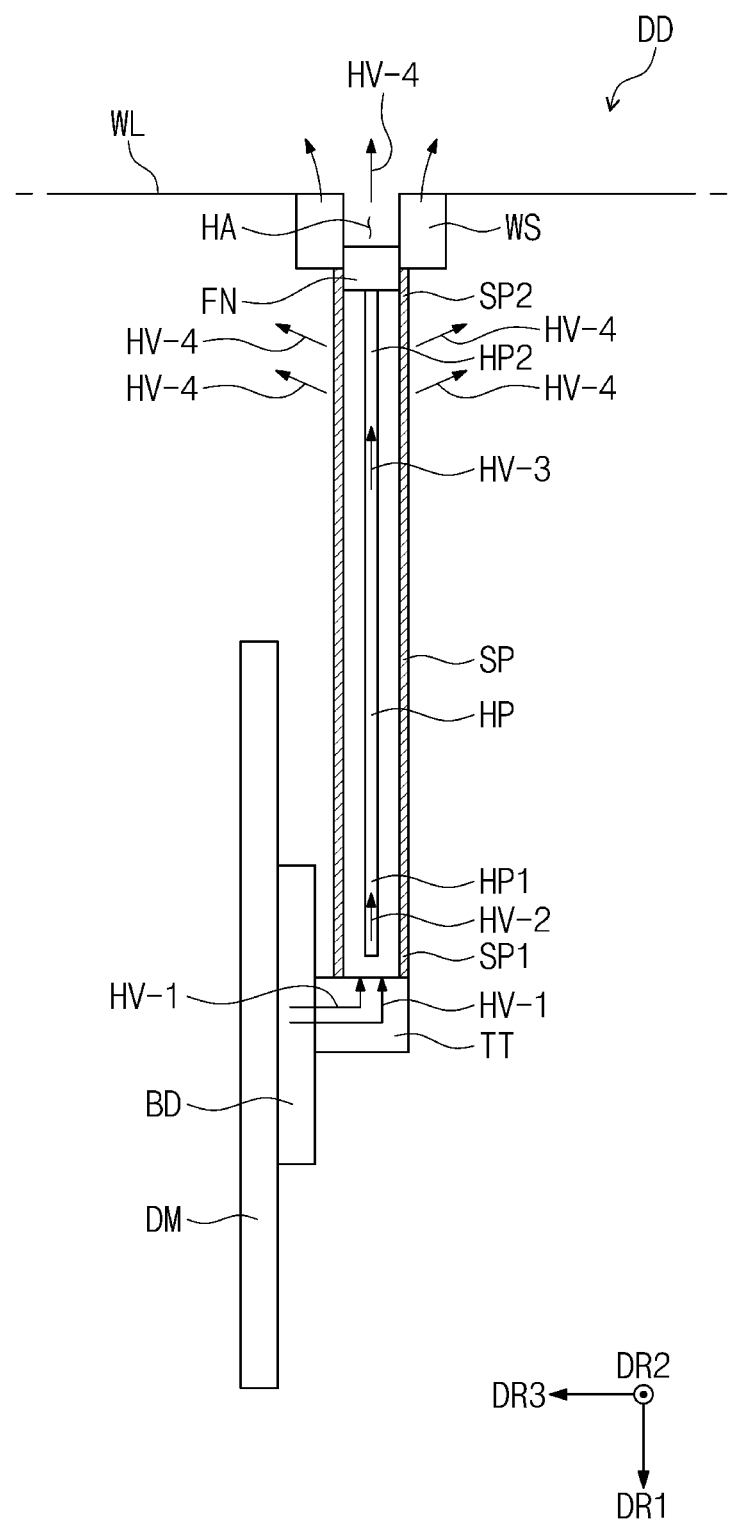
FIG. 5 is a cross-sectional view illustrating still another embodiment of a display device.

FIG. 5 is a cross-sectional view illustrating still another embodiment of a display device.

Referring to FIG. 5, a fan FN may be provided at an end portion of the connection rod SP which is adjacent to the fixing member WS, of the heat pipe HP. The fan FN may be positioned inside the fixing member WS, such as within a hole HA defined in the fixing member WS. However, this is provided only for illustrative purpose, and the fan FN may be disposed inside the connection rod SP, such as at an end portion of the connection rod SP which is adjacent to the fixing member WS.

The fan FN may facilitate the radiation of the fourth heat HV-4 received from the heat pipe HP to outside the connection rod SP and the heat pipe HP therein. The fourth heat HV-4 may be radiated to the ceiling WL by the fan FN. Accordingly, the heat radiation function of the display device DD may be more improved. Additionally, the deterioration and the life span of the display module DM, which are caused by heat emitted from the display module DM, may be reduced or effectively prevented.

According to one or more embodiment of the invention, the heat pipe HP may transfer heat emitted from the display module DM. The fan FN disposed at the end portion of the heat pipe HP may efficiently transfer the heat emitted from the display module DM to the outside of the display module DM. Accordingly, the heat radiation function of the display device DD may be more improved.

Figure 6:
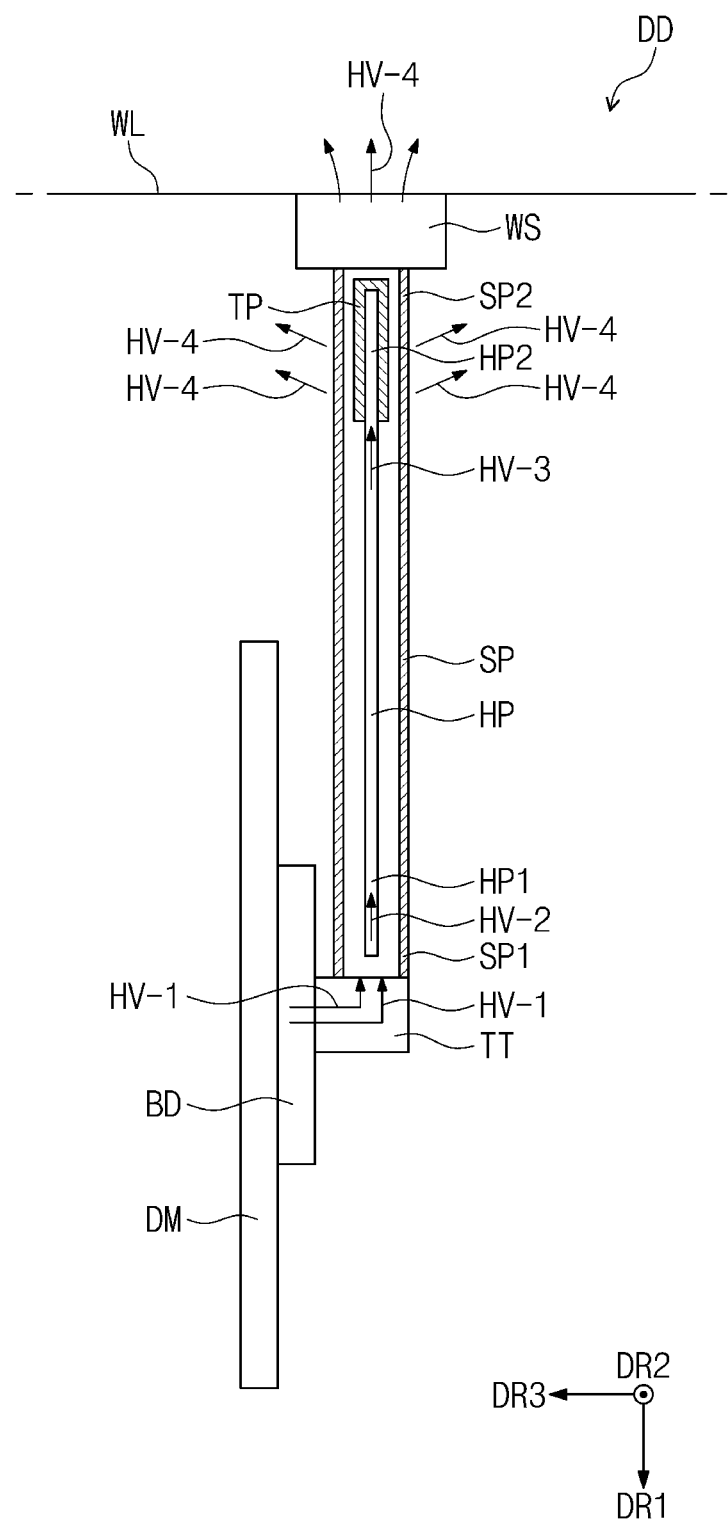
FIG. 6 is a cross-sectional view illustrating yet another embodiment of a display device.

FIG. 6 is a cross-sectional view illustrating yet another embodiment of a display device.

Referring to FIG. 6, a heat radiation tape TP may surround a portion of the condensing portion HP2. However, this is provided for the illustrative purpose. According to one or more embodiment of the invention, the heat radiation tape TP may surround an entirety of the heat pipe HP. An outer surface of the heat radiation tape TP may be spaced apart from an inner wall of the connection rod SP, but is not limited thereto.

The heat radiation tape TP may make physical and/or thermal contact with the heat pipe HP to radiate heat which is provided from the heat pipe HP, to outside the heat pipe HP and/or the heat radiation tape TP.

The heat radiation tape TP may relatively easily discharge the third heat HV-3 transferred through the heat pipe HP to outside the heat pipe HP and/or the heat radiation tape TP. The third heat HV-3 discharged to the outside of the connection rod SP, the heat pipe HP and/or the heat radiation tape TP via the heat radiation tape TP, may be expressed as the fourth heat HV-4. The third heat HV-3 from the condensing portion HP2 physically and/or thermally contacted by the heat radiation tape TP may be efficiently discharged to the outside by the heat radiation tape TP as the fourth heat HV-4. Accordingly, the heat radiation function of the display device DD may be more improved. Additionally, deterioration and the life span of the display module DM, which are caused by heat emitted from the display module DM, may be reduced or effectively prevented.

According to one or more embodiment of the invention, the heat pipe HP may transfer heat emitted from the display module DM, away from the display module DM. The heat radiation tape TP surrounding a portion or an entirety of the heat pipe HP may efficiently transfer the heat emitted from the display module DM to a location disposed at a distance from the display module DM. Accordingly, the heat radiation function of the display device DD may be more improved.

Figure 7:
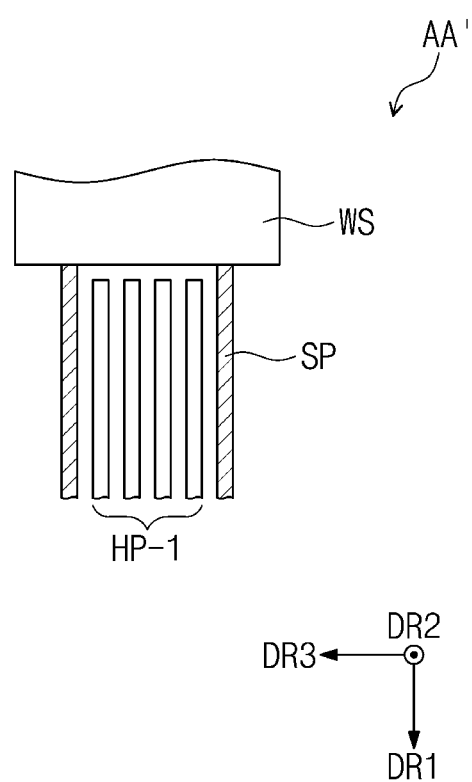
FIG. 7 is an enlarged cross-sectional view illustrating a modified embodiment of a display device, corresponding to portion AA' illustrated in FIG. 2.

FIG. 7 is an enlarged cross-sectional view illustrating a modified embodiment of a display device corresponding to portion AA' in FIG. 2.

Referring to FIG. 7, a plurality of heat pipes HP-1 may be provided inside the connection rod SP. One or more embodiment of the heat pipe HP discussed for FIGS. 2-6 may be applied at the heat pipe HP within the plurality of heat pipes HP-1. The plurality of heat pipes HP-1 may increase the transfer efficiency of heat emitted from the display module DM, through the connection rod SP. The heat pipes HP-1 may transfer a relatively large amount of heat from the display module DM, through the connection rod SP, and to a location disposed at a distance away from the display module DM. Accordingly, the heat radiation function of the display device DD may be more improved.

Figure 8:
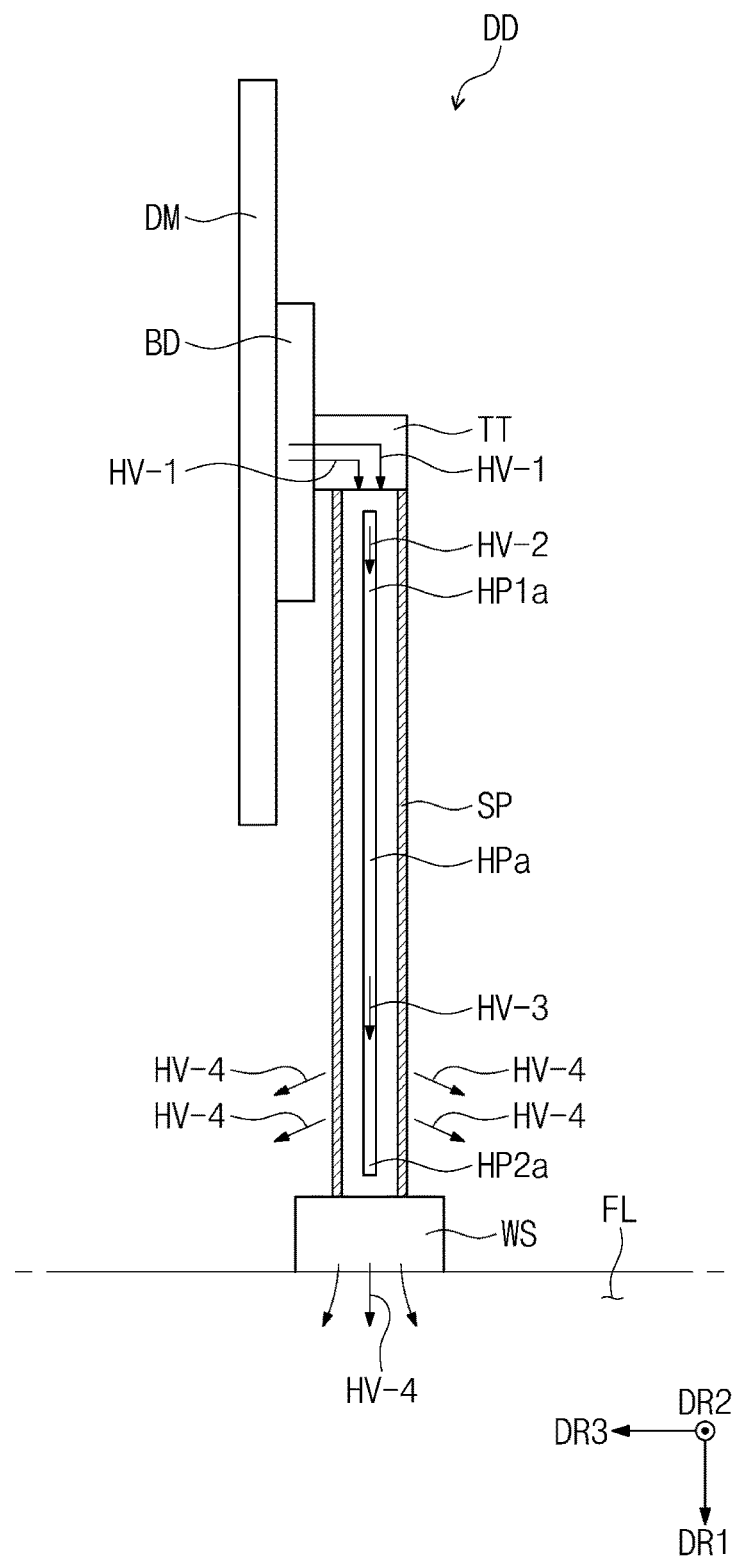
FIG. 8 is a cross-sectional view illustrating another embodiment of a display device relative to a structure to which the display device is mounted.

FIG. 8 is a cross-sectional view illustrating another embodiment of a display device relative to a structure to which the display device is mounted. The same reference numerals are assigned to components described with reference to FIG. 2 and the redundant details will be omitted.

Referring to FIG. 8, a display device DD may be illustrated as a stand-mounted television by way of example.

A bracket BD may transfer first heat HV-1 emitted from a display module DM to a heating portion HP1a of a heat pipe HPa.

The heat pipe HPa may receive the first heat HV-1. The heat transferred through the heat pipe HPa is expressed as second heat HV-2. The temperature of the second heat HV-2 may be equal to or lower than the temperature of the first heat HV-1. The second heat HV-2 may be transferred from the heating portion HP1a to a condensing portion HP2a. The second heat HV-2 may be transferred along the first direction DR1. The second heat HV-2 transferred along the first direction DR1 may be expressed as third heat HV-3 at the condensing portion HP2a. The temperature of the third heat HV-3 may be equal to or lower than the temperature of the second heat HV-2.

The third heat HV-3 discharged from the heat pipe HPa to outside the heat pipe HPa and/or the connection rod SP is expressed as the fourth heat HV-4. The temperature of the fourth heat HV-4 may be equal to or lower than the temperature of the third heat HV-3. The fourth heat HV-4 may be transferred to outside the connection rod SP, at a distance away from the display module DM.

The fourth heat HV-4 which is emitted from the connection rod SP, may be transferred to the environment or atmosphere outside of the display device DD. Referring to FIG. 8, the fourth heat HV-4 may be transferred to the outside environment as a floor FL, through a fixing member WS in physical and/or thermal connection with the floor FL. The floor FL is considered as another structure to which the display device DD is mounted, by way of example.

According to one or more embodiment of the invention, the first heat HV-1 emitted from the display module DM may be transferred, in the form of the fourth heat HV-4, to outside of the display device DD through the heat pipe HPa. Accordingly, the heat radiation function of the display device DD may be more improved. The display device DD having the improved heat radiation function may increase electrical current input thereto and may increase brightness thereof to improve overall display quality.

The working material heated inside the heat pipe HPa may be moved in the first direction DR1. The first direction DR1 may be the direction of gravity. In this case, the heat pipe HPa may be a sintered heat pipe. However, this is provided for illustrative purpose. According to one or more embodiment of the invention, the heat pipe may include various types of heat pipes. In an embodiment, for example, the heat pipe HPa may be a capillary return heat pipe.

According to one or more embodiment of the invention, a mounting device and a display device DD including the same may include a heat pipe HP (or heat pipe HPa) disposed inside a connection rod SP and lengthwise extended along a first direction (e.g., a direction parallel to a direction of gravity). The heat pipe HP (or heat pipe HPa) may transfer heat emitted from a heat-generating component of the display device DD, like a display module DM thereof. The heat pipe HP (or heat pipe HPa) may transfer the heat which is emitted from the heat-generating component of the display device DD, to the outside of the display device DD. Accordingly, the heat radiation function of the display device DD may be more improved. The display device having the improved heat radiation function may increase electrical current input thereto and may increase brightness thereof to improve overall display quality.

While the invention has been described with reference to exemplary embodiments, it will be apparent to those skilled in the art that various changes and modifications may be made without departing from the spirit and scope of the invention. Therefore, it should be understood that the above embodiments are not limiting, but illustrative.

What is claimed is:

1. A display device comprising:
a display module from which heat is emitted;
a connection rod coupled to the display module and with which the display module is mountable to a structure disposed external to the display device and spaced apart from the display module along a first direction, the connection rod lengthwise extending along the first direction; and
a heat pipe disposed inside the connection rod and lengthwise extending along the first direction.

2. The display device of claim 1, wherein the heat pipe disposed inside the connection rod comprises end portions opposing each other along the first direction, and
further comprising a heat radiation plate disposed inside the connection rod at an end portion of the heat pipe which is furthest along the first direction from the display module among the end portions opposing each other.

3. The display device of claim 1, wherein the heat pipe disposed inside the connection rod comprises end portions opposing each other along the first direction, and
further comprising a fan disposed at an end portion of the heat pipe which is furthest along the first direction from the display module among the end portions opposing each other.

4. The display device of claim 1, wherein the heat pipe disposed inside the connection rod comprises end portions opposing each other along the first direction, and
further comprising a heat radiation tape which surrounds an end portion of the heat pipe which is furthest along the first direction from the display module among the end portions opposing each other.

5. The display device of claim 1, wherein the heat pipe is provided in plural to define a plurality of heat pipes disposed inside the connection rod.

6. The display device of claim 1, further comprising:
a bracket coupled the display module, and
a rotation coupling member which pivotably couples the bracket and the connection rod to each other.

7. The display device of claim 6, wherein
the connection rod comprises end portions opposing each other along the first direction, and
the rotation coupling member is coupled to a first end portion of the connection rod which is closest along the first direction to the display module among the end portions opposing each other,
further comprising a fixing member coupled to a second end portion of the connection rod which is furthest along the first direction from the display module among the end portions opposing each other.

8. The display device of claim 7, further comprising:
a hole defined in the fixing member coupled to the second end portion of the connection rod,
a fan disposed inside the hole.

9. The display device of claim 1, wherein the heat pipe includes a heat-carrying material which carries heat and circulates inside the heat pipe.

10. The display device of claim 9, wherein the heat-carrying material includes water, ethanol or alcohol.

11. The display device of claim 1, wherein the display module is a liquid crystal display module or an organic light emitting display module.

12. The display device of claim 1, wherein the display module includes a display surface which is parallel to a plane defined by the first direction and a second direction which crosses the first direction.

13. A mounting device comprising:
a connection rod including:
a first end portion at which the connection rod is coupleable to a heat-generating display module,
a second end portion opposing the first end portion along a first direction, and an inner space extending along the first direction, between the first end portion and the second end portion;
a bracket connected to the first end portion of the connection rod;
a fixing member connected to the second end portion of the connection rod; and
a heat pipe which carries heat, the heat pipe disposed at the inner space of the connection rod and extending along the first direction, between the first end portion and the second end portion of the connection rod.

14. The mounting device of claim 13, further comprising a heat radiation plate disposed at the inner space of the connection rod, at an end portion of the heat pipe which corresponds to the second end portion of the connection rod.

15. The mounting device of claim 13, further comprising a fan disposed at an end portion of the heat pipe which corresponds to the second end portion of the connection rod.

16. The mounting device of claim 13, further comprising a heat radiation plate which surrounds a portion of the heat pipe, the heat radiation plate disposed between an inner wall of the connection rod and an outer wall of the heat pipe.

17. The mounting device of claim 13, further comprising:
a hole defined in the fixing member connected to the second end portion of the connection rod, and
a fan disposed inside the hole.

18. The mounting device of claim 13, wherein the heat pipe includes a heat-carrying material which carries heat and circulates inside the heat pipe.

19. The mounting device of claim 18, wherein the heat-carrying material includes water, ethanol or alcohol.

20. The mounting device of claim 13, wherein the heat pipe is a sintered heat pipe.

* * * * *